(12) United States Patent
Oku et al.

(10) Patent No.: US 11,119,402 B2
(45) Date of Patent: Sep. 14, 2021

(54) METHOD FOR MANUFACTURING OF PELLICLE

(71) Applicant: AIR WATER INC., Sapporo (JP)

(72) Inventors: Hidehiko Oku, Nagano (JP); Ichiro Hide, Nagano (JP)

(73) Assignee: Air Water Inc., Sapporo (JP)

( * ) Notice: Subject to any disclaimer, the term of this patent is extended or adjusted under 35 U.S.C. 154(b) by 360 days.

(21) Appl. No.: 16/329,020

(22) PCT Filed: Aug. 25, 2017

(86) PCT No.: PCT/JP2017/030578
§ 371 (c)(1),
(2) Date: Feb. 27, 2019

(87) PCT Pub. No.: WO2018/043347
PCT Pub. Date: Mar. 8, 2018

(65) Prior Publication Data
US 2019/0204731 A1 Jul. 4, 2019

(30) Foreign Application Priority Data

Aug. 29, 2016 (JP) .............................. JP2016-167257

(51) Int. Cl.
*G03F 1/64* (2012.01)
*G03F 1/62* (2012.01)

(52) U.S. Cl.
CPC . *G03F 1/64* (2013.01); *G03F 1/62* (2013.01)

(58) Field of Classification Search
CPC ...................................... G03F 1/62; G03F 1/64
USPC ............................................................ 430/5
See application file for complete search history.

(56) References Cited

U.S. PATENT DOCUMENTS

| 5,793,836 | A | 8/1998 | Maldonado et al. |
| 2005/0025959 | A1 | 2/2005 | Bellman |
| 2009/0104544 | A1 | 4/2009 | Kubota et al. |
| 2009/0274962 | A1 | 11/2009 | Kubota et al. |
| 2016/0147141 | A1 | 5/2016 | Ono et al. |
| 2016/0195804 | A1 | 7/2016 | Kim et al. |
| 2017/0082920 | A1 | 3/2017 | Tseng et al. |
| 2017/0192349 | A1 | 7/2017 | Kohmura et al. |

FOREIGN PATENT DOCUMENTS

| JP | 09-310170 | A | 12/1997 |
| JP | 2009-116284 | A | 5/2009 |
| JP | 2009-271262 | A | 11/2009 |
| JP | 2012-119655 | A | 6/2012 |
| JP | 2016-130789 | A | 7/2016 |
| JP | 2016-151642 | A | 8/2016 |
| JP | 2017-155064 | A | 8/2017 |
| WO | 2014188710 | A1 | 11/2014 |
| WO | 2015-166927 | A1 | 11/2015 |
| WO | 2016-116329 | A1 | 7/2016 |
| WO | 2014-188710 | A1 | 2/2017 |

OTHER PUBLICATIONS

Extended European Search Report, dated Aug. 8, 2019 in European Patent Application No. EP 17 84 6352.
M. L. Schattenburg et al., "Maskless Single-Sided Wet Etching Process for the Fabrication of Ultra-Low Distortion Polyimide Membranes", MRS Proceedings, Jan. 1, 1994, vol. 356, pp. 615-620, Materials Research Society.
Office Action dated Oct. 28, 2020 in Taiwanese Application TW 106129132.
International Preliminary Report on Patentability and Written Opinion, dated Mar. 5, 2019 in International Application No. PCT/JP2017/030578.
Office Action dated Jul. 28, 2020 in Japanese Patent Application No. 2016-167257.
International Search Report dated Nov. 14, 2017 in International Patent Application No. PCT/JP2017/030578.
Office Action dated Mar. 17, 2021 in Taiwan patent application TW106129132.
Office Action dated Feb. 24, 2021 in Japanese Patent Application No. JP 2016-167257.

*Primary Examiner* — Christopher G Young
(74) *Attorney, Agent, or Firm* — Wood, Phillips, Katz, Clark & Mortimer

(57) ABSTRACT

A method for manufacturing of a pellicle that can simplify the manufacturing process is provided. The method for manufacturing of a pellicle comprises a step for forming a SiC film on a bottom surface of a Si substrate, a step for bonding a supporting member including a through hole to a bottom surface of the SiC film, and a step for removing the Si substrate, after bonding the supporting member.

8 Claims, 10 Drawing Sheets

METHOD FOR MANUFACTURING OF PELLICLE

TECHNOLOGICAL FIELD

The present invention relates to a method for manufacturing of a pellicle. More specifically, it relates to a method for manufacturing of a pellicle with a SiC (silicon carbide) film.

DESCRIPTION OF THE RELATED ART

Photolithography technology is one of manufacturing techniques for semiconductor elements. According to the photolithography technology, with the miniaturization of semiconductor elements, shortening of wavelength of the light source of the exposure devices is progressing. Currently, as a light source of an exposure device used in a state-of-the-art semiconductor element manufacturing factory, KrF (krypton fluoride) excimer laser (wavelength 248 nanometers), ArF (argon fluoride) excimer laser (wavelength 193 nanometers) or the like is mainly used. As a light source of the next generation, development of a light source of EUV (Extreme Ultraviolet) Sight (wavelength 13.5 nanometers) is proceeding.

According to photolithography technology, in order to prevent foreign matter adhesion to a mask, a pellicle is pasted on the photo mask. A pellicle film which is a part of the pellicle for transmitting light from a light source of an exposure device also evolves with the evolution of a light source of an exposure device. When ArF excimer laser etc. was used as a light source of an exposure device (an ArF generation light source), organic materials were used as pellicle films. As the pellicle film for EUV light, it is studied to use inorganic materials having high transmittance and resistance to EUV light. For example, such inorganic materials include Si (silicon), SiN (nitride silicon), SiC, C (graphite, graphene, diamond like carbon, amorphous carbon, etc.), and the like.

Among inorganic materials, since SiC has high light transmittance and resistance in particular, it is suitable for pellicle films for EUV light. On the other hand, even though SiC is a material with high mechanical strength, when using a SiC thin film as a pellicle film, it is necessary to support a part of the SiC thin film with a supporting member consisting of a Si substrate etc. Normally, after a SiC thin film was formed on a Si substrate, a pellicle which supports a part of the SiC thin film with the Si substrate is made by etching a part of the Si substrate.

Methods for manufacturing pellicles having SiC thin films are disclosed in the Patent Documents 1 and 2 below, for example. The Patent Document 1 discloses the technology in which a poly-crystal SiC film is formed on a support material as a Si substrate. After that, the Si substrate becomes a mesh shape, since a part of the Si substrate is wet-etched.

The Patent Document 2 discloses a method for manufacturing a composite member of a pellicle film being composed of a Si crystal and a second pellicle frame being composed of a Si substrate. According to this method for manufacturing, a SiC crystal film is formed on a Si substrate. The central part of the Si substrate is etched from the side of the Si substrate where the Si crystal film is not formed. As a result, the Si substrate of this central part is removed.

Further, the Patent Document 2 below discloses that a SiC may be used as a pellicle film.

PRIOR ART DOCUMENT(S)

Document(s) Related to Patents

[Patent Document 1] international Publication No. 2014/188710 pamphlet.
[Patent Document 2] International Publication No. 2015/166927 pamphlet.

SUMMARY OF THE INVENTION

Problems to be Resolved by the Invention

As described above, a pellicle with a SiC thin film was conventionally made by etching a pan of a Si substrate after forming the SiC thin film on the Si substrate. For this reason, the manufacturing process was complicated. In addition, due to the complexity of the manufacturing process, the manufacturing cost has been increased.

That is, when etching a part of the Si substrate, the steps are necessary, in which a step for forming photoresist on the Si substrate, a step for patterning by exposing the photoresist, a step for etching a part of the Si substrate with the photoresist as a mask, and a step for removing the photoresist after the etching. In order to improve etching selectivity of Si, the steps are necessary, in which a step for forming a hard mask (such as SiC or SiN) on a Si substrate, a step for forming photoresist on the hard mask, a step for patterning by exposing the photoresist, a step for etching the hard mask with the photoresist as a mask, a step for etching a part of the Si substrate with the hard mask as a mask, and a step for removing the photoresist and the hard mask after the etching. In addition, it is necessary to prepare a mask for exposing the photoresist.

The present invention is intended to solve the above problems. The purpose is to provide a method for manufacturing a pellicle which can simplify the manufacturing process.

Summary of the Invention

According to one aspect of the present invention, a method for manufacturing a pellicle comprising steps of forming a SiC film on one of principal surfaces of a substrate, tending a supporting member including a through hole to a principal surface of the SiC film on art opposite side from a principal surface on a side where the substrate exists, and removing the substrate, after tending the supporting member.

In the method for manufacturing a pellicle, preferably, thickness of the SiC film is 20 nanometers or more and 10 micrometers or less.

In the method for manufacturing a pellicle, preferably, the substrate is made of Si.

In the method for manufacturing a pellicle, preferably, the supporting member has a ring-like planar shape.

In the method for manufacturing a pellicle, preferably, the step for removing the substrate includes a step for relatively moving the substrate, the SiC film and the supporting member, relative to liquid chemical capable of wet etching the substrate.

In the method for manufacturing a pellicle, preferably, the substrate, the SiC film and the supporting member are moved in a direction in a plane parallel to another of the principal surfaces of the substrate, in the step of moving the substrate, the SiC film and the supporting member relative to the liquid chemical.

In the method for manufacturing a pellicle, preferably, the liquid chemical is injected onto another of the principal surfaces of the substrate, with the substrate, the SiC film, and the supporting member rotated, in the step of moving the substrate, the SiC film and the supporting member relative to the liquid chemical.

In the method for manufacturing a pellicle, preferably, mixed acid including hydrofluoric acid and nitric acid is used as the liquid chemical.

Effect of the Invention

According to the present invention, it is possible to provide a method for manufacturing a pellicle which can simplify the manufacturing process.

DETAILED DESCRIPTION OF EMBODIMENTS

Hereinafter, embodiments of the present invention will be described with reference to the drawings.

Figure 1:
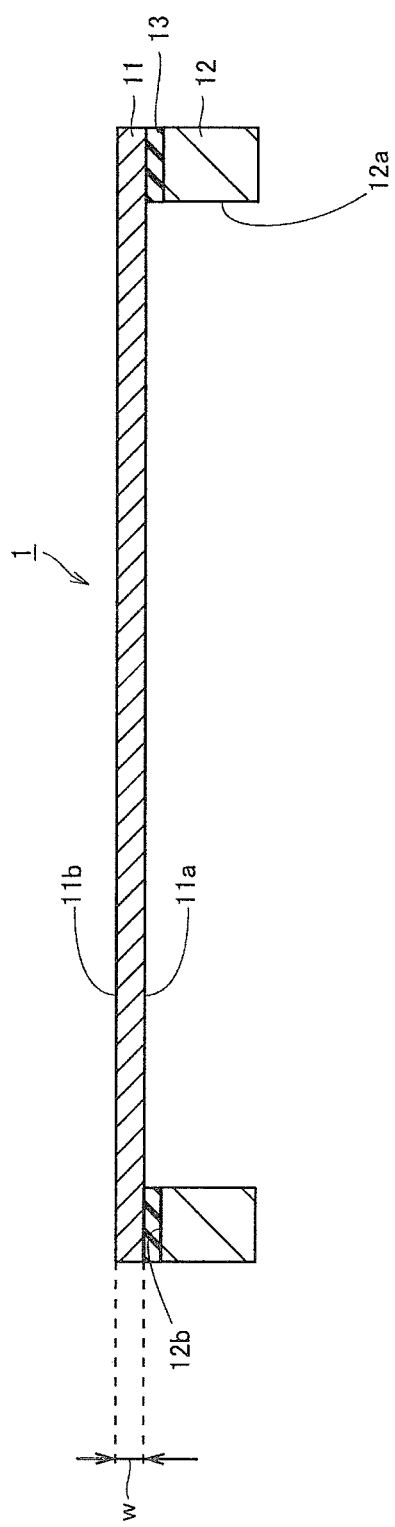
FIG. 1 is a cross-sectional view showing a configuration of pellicle 1, according to one embodiment of she present invention.

FIG. 1 is a cross-sectional view showing a configuration of pellicle 1 in one embodiment of the present invention. Note that FIG. 1 is a cross-sectional view in a case of cutting with a plane perpendicular to the top surface 11b of SiC film 11.

Referring to FIG. 1, pellicle 1 in the present embodiment includes SiC film 11, supporting member 12, and adhesive layer 13.

The supporting member 12 includes through hole 12a and has a ring-like planar shape. The supporting member 12 should include a through hole. In addition to the ring-like planar shape, supporting member 12 may have a planar shape such as a mesh-like shape having many through holes.

The supporting member 12 is made of any material. For example, the supporting member 12 is made of Al (aluminum), Al alloy (5000 series, 6000 series, 7000 series etc.), stainless steel, Si, Si alloy, Fe (iron), Fe series alloy, carbon steel, tool steel, ceramics, metal-ceramics composite material, resin, or the like. In particular, from the viewpoint of being lightweight and high in rigidity, supporting member 12 is preferably made of Al or an Al alloy.

SiC film 11 is provided on top surface 12b of supporting member 12. SiC film 11 includes bottom surface 11a and top surface 11b. The bottom surface 11a of SiC film 11 is exposed to through hole 12a of ring-like supporting member 12.

SiC film 11 has a thickness w of 20 nanometers or more and 10 micrometers or less. The thickness w is preferably 1 micrometer or less, more preferably 500 nanometers or less. SiC film 11 is made of single-crystal 3C—SiC, poly-crystal 3C—SiC, amorphous SiC, or the like. In particular, when SiC film 11 is epitaxially grown on the surface of Si substrate 21 (FIG. 3) which will be explained later. SiC film 11 generally consists of 3C—SiC.

Adhesive layer 13 is provided between SiC film 11 and supporting member 12, to directly bond SiC film 11 and supporting member 12. Adhesive layer 13 is made of any material. For example, adhesive layer 13 consists of acrylic resin adhesive, epoxy resin adhesive, polyimide resin adhesive, silicone resin adhesive, inorganic adhesive, double-sided adhesive tape, silicone resin adhesive, acrylic adhesive, polyolefin adhesive, or the like.

Figure 2:
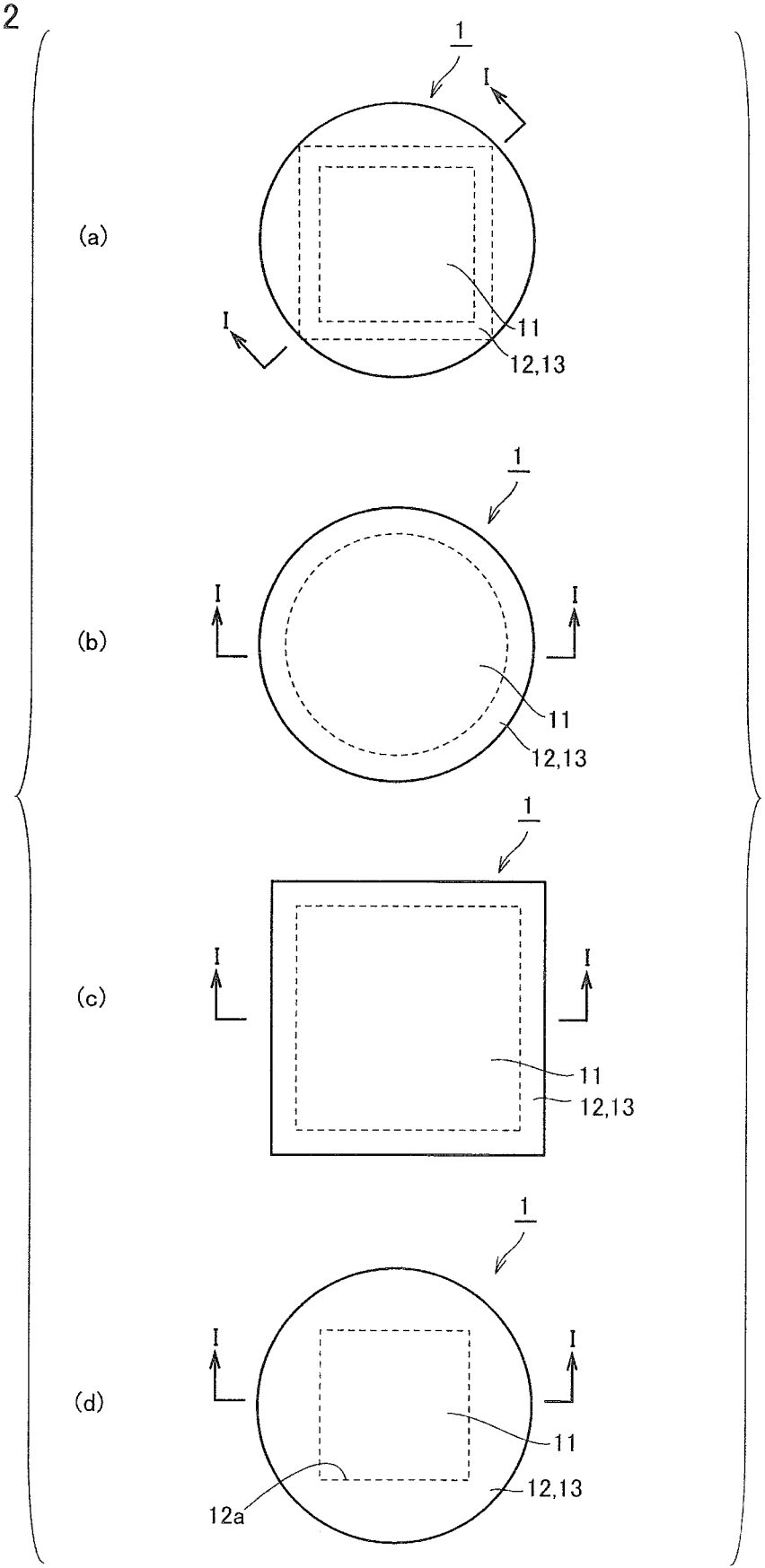
FIG. 2 is a plan view showing the configuration of pellicle 1 as seen from the top surface 11b side of SiC film 11, according to one embodiment of the present invention.

FIG. 2 shows a plan view showing the configuration of pellicle 1 as seen from the top surface 11b side of SiC film 11, in one embodiment of the present invention. In FIG. 2, supporting member 12 and adhesive layer 13 are indicated by dotted lines for the purpose of showing the shapes of supporting member 12 and adhesive layer 13. Actually, supporting member 12 and adhesive layer 13 are not directly visible. Also, FIG. 1 corresponds to the cross-sectional view along line I-I in FIG. 2.

Referring to FIG. 2, each of SiC film 11 and supporting member 12 has an arbitrary planar shape. SiC film 11 is partly supported by the ring-like supporting member 12. In this way, the mechanical strength of SiC film 11 is reinforced by supporting member 12. For example, as shown in FIG. 2(a), SiC film 11 may have a circle planar shape. Supporting member 12 may have a square ring-like planar shape. According to the structure shown in FIG. 2(a), depending on the thickness of SiC film 11, it is also possible that a part of SiC film 11 existing outside supporting member 12 may be broken, so that SiC film 11 may become the same planar shape as the outer shape of supporting member 12 (shape shown in FIG. 2(c) which will be explained later). Further, as shown in FIG. 2(b), SiC film 11 may have a circle planar shape. Supporting member 12 may have a circle ring-like planar shape. Further, as shown in FIG. 2(c), SiC film 11 may have a rectangular planar shape. Supporting member 12 may have a square ring-like planar shape. Further, as shown in FIG. 2(d), each of SiC film 11 and supporting member 12 may have a circle planar shape. Through hole 12a may have a rectangular planar shape. The sizes of supporting member 12 and through hole 12a are arbitrary. It may be determined according to the mechanical strength, light transmittance, etc. required for pellicle 1.

Next, methods for manufacturing of pellicle 1 in this embodiment will be described with reference to FIGS. 3 to 6.

Figure 3:
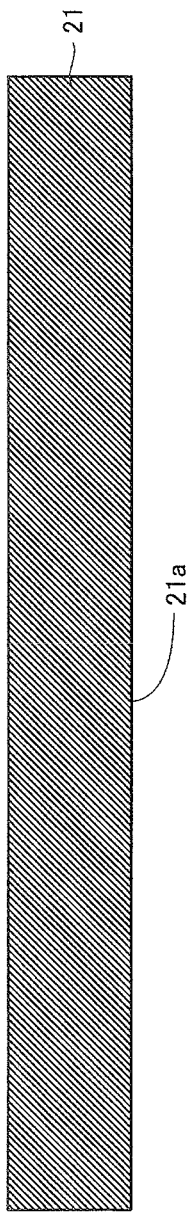
FIG. 3 is a cross-sectional view showing the first step of a method for manufacturing of pellicle 1 in one embodiment of the present invention.

Referring to FIG. 3, for example, disc-shaped Si substrate 21 is prepared. The (111) plane is exposed at bottom surface 21a of Si substrate 21. The (100) plane or the (110) plane may be exposed at the bottom surface 21a of Si substrate 21.

Figure 4:
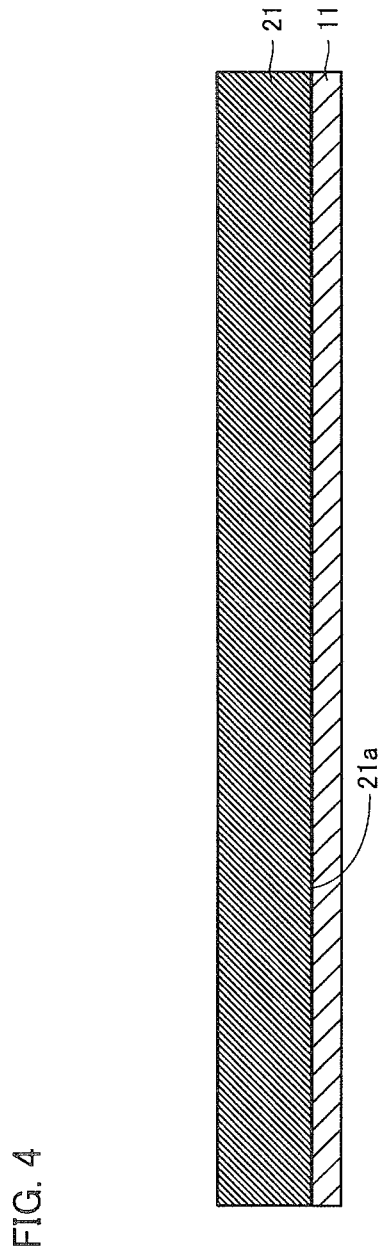
FIG. 4 is a cross-sectional view showing the second step of the method for manufacturing of pellicle 1 in one embodiment of the present invention.

Referring to FIG. 4 next, SiC film 11 is formed on bottom surface 21a of Si substrate 21. For example, SiC film 11 is formed on a foundation layer made of SiC obtained by carbonizing bottom surface 21a of Si substrate 21, by using the gas source MBE (Molecular Beam Epitaxy) method, the CVD (Chemical Vapor Deposition) method (including the LPCVD and the plasma CVD), or the like. Also, SiC film 11 may be formed only by carbonizing the bottom surface 21a of Si substrate 21. Further, the SiC film 11 may be formed on the bottom surface 21a of the Si substrate 21, using the gas source MBE method, the CVD method (including the LPCVD and the plasma CVD), or the like. Preferably, SiC film 11 may be formed using the ultra-high vacuum CVD. In this case, SiC film 11 is formed using VCE (Vacuum Chemical Epitaxy) (registered trademark) device, for example, and the growth pressure is $10^{-4}$ to 1 Pa.

As a substrate to be a foundation of SIC film 11, any arbitrary one can be used. It is preferably determined in consideration of the crystal property of the upper layer SiC film and ease of the removal in the post process. Specifically, as a substrate to be a foundation of SiC film 11, a quartz substrate or the like may be used, instead of Si substrate 21.

Figure 5:
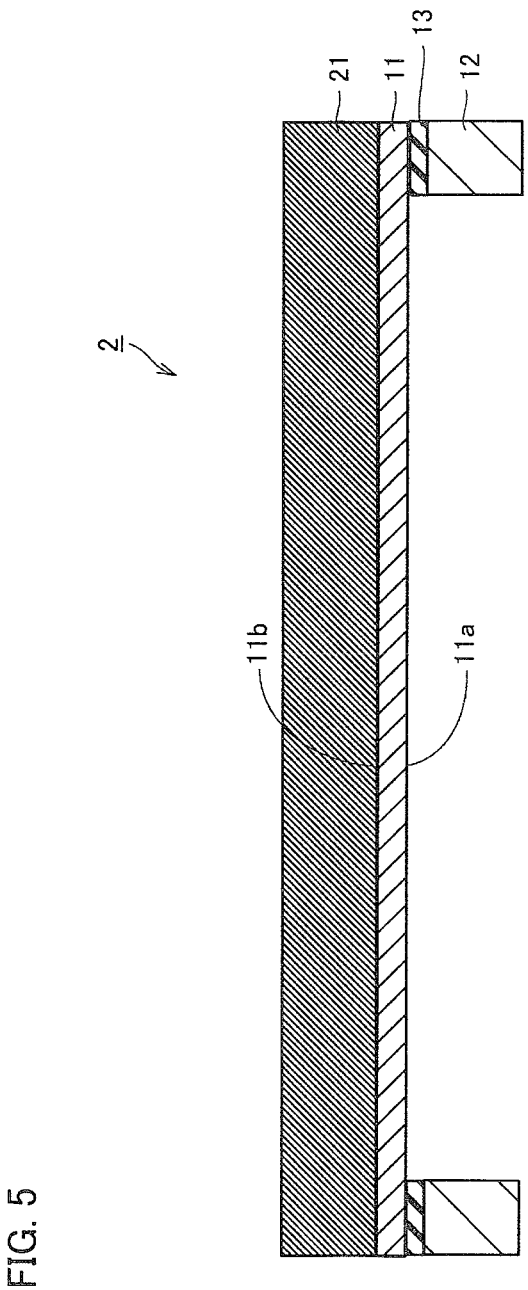
FIG. 5 is a cross-sectional view showing the third step of the method for manufacturing of pellicle 1 in one embodiment of the present invention.

Referring to FIG. 5 next, using adhesive layer 13, supporting member 12 is bonded to the bottom surface 11a of SiC film 11. Bottom surface 11a is a principal surface being the opposite side to the principal surface (top surface 11b) on the side where Si substrate 21 exists on SiC film 11. In this way, intermediary body 2 including Si substrate 21, SiC film 11, supporting member 12, and adhesive layer 13 is obtained.

Figure 6:
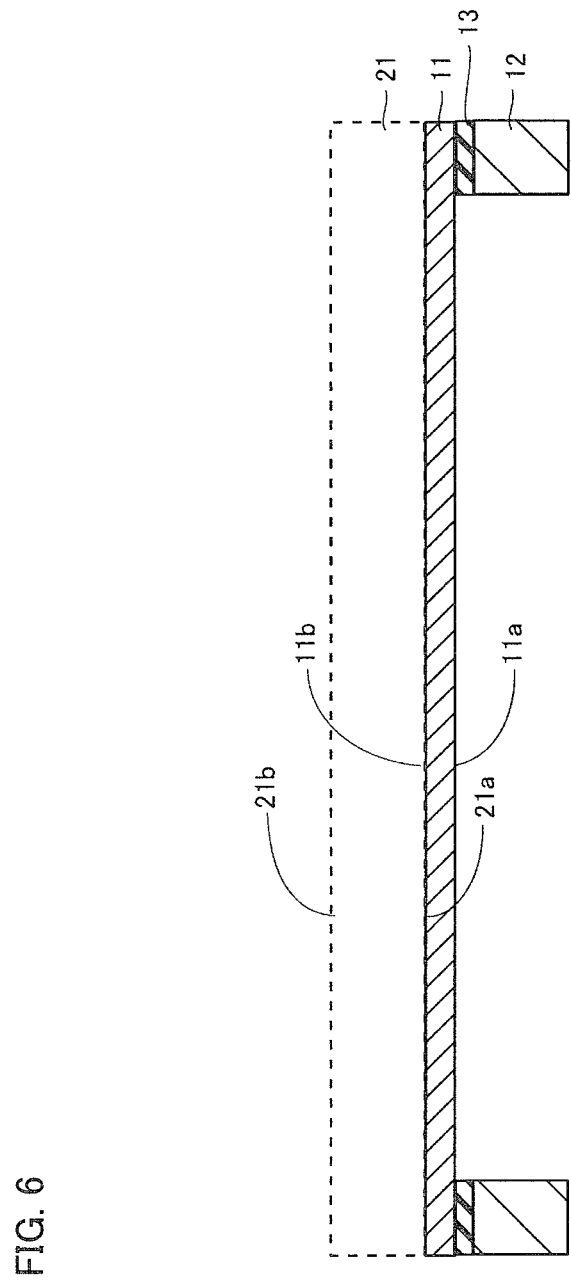
FIG. 6 is a cross-sectional view showing the fourth step of the method for manufacturing of pellicle 1 in one embodiment of the present invention.

Referring to FIG. 6, Si substrate 21 is removed from intermediary body 2 subsequently. In this way, the entire top surface 11b of SiC film 11 is exposed. When removing Si substrate 21, it is preferable to remove completely Si substrate 21 in the following manner. The Si is removed by a method in which the removal rate of Si is relatively fast (such as mechanical polishing). Hence, the thickness of Si substrate 21 is reduced to any thickness. Subsequently, the Si is removed by a method in which the removal rate of Si is relatively slow (such as wet etching).

Liquid chemical used for performing wet etching of Si may be liquid chemical capable of wet etching Si. For example, it may be mixed acid including hydrofluoric acid and nitric acid, potassium hydroxide (KOH) aqueous solution, or the like.

The wet etching of Si is preferably performed by relatively moving intermediary body 2 with respect to liquid chemical. Moving intermediary body 2 includes rotating intermediary body 2 without changing the position of intermediary body 2, changing the position of intermediary body 2 (in other words, moving intermediary body 2), rotating intermediary body 2 while changing the position of intermediary body 2, and so on.

When an alkaline solution such as an aqueous solution of potassium hydroxide is used as liquid chemical for wet etching of Si, SiC film 11 may also be etched through pinholes present in low density in SiC film 11. It is preferable to use mixed acid described above as the liquid chemical for wet etching of Si, to prevent the SiC film 11 from being etched, and to Improve the quality of SiC film 11.

The direction of moving intermediary body 2 during wet etching of Si is arbitrary. However, in order to avoid the situation that SiC film 11 is damaged by the pressure received from liquid chemical while moving intermediary body 2, it is preferable to move intermediary body 2 in a direction within a plane parallel to the top surface 21b of Si substrate 21 (planes PL in FIGS. 7 to 9) as in the following first to third methods. Note that the top surface 21b is a principal surface on the opposite side from the bottom surface 21a which is a principal surface on the side where SiC film 11 is formed on Si substrate 21.

Figure 7:
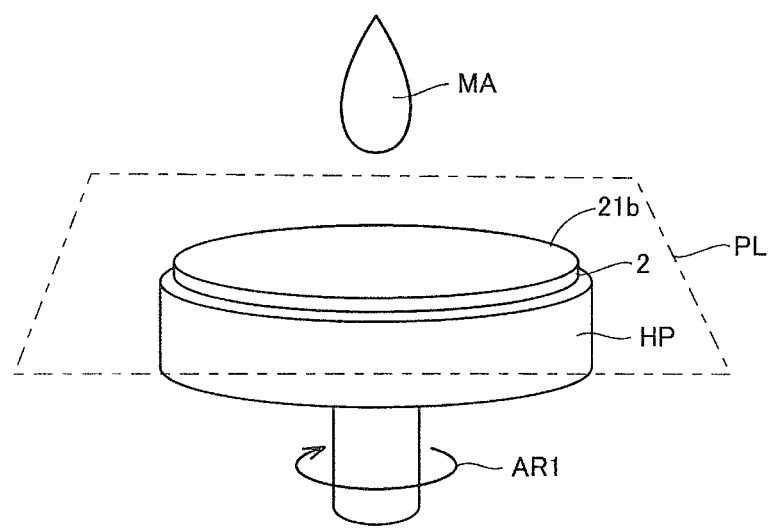
FIG. 7 is a view schematically showing a first method of wet etching of Si in one embodiment of the present invention.
Figure 8:
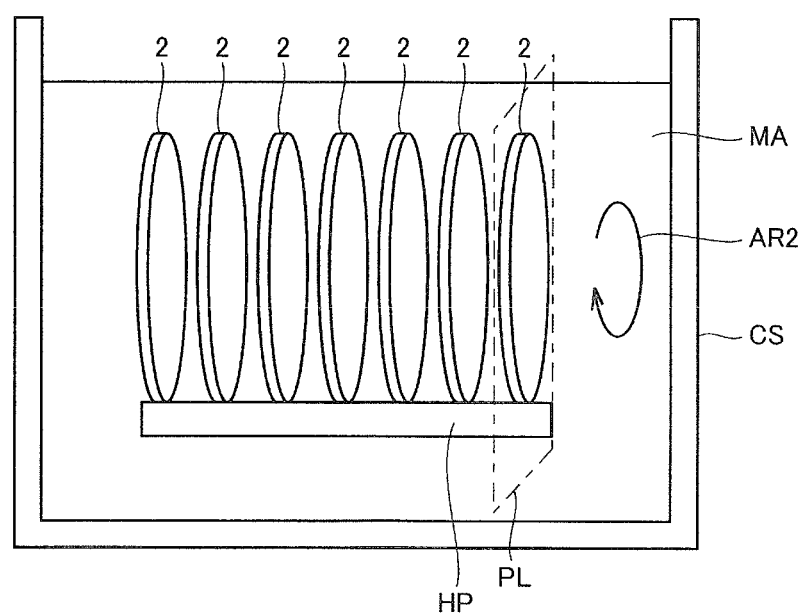
FIG. 8 is a view schematically showing a second method of wet etching of Si in one embodiment of the present invention.
Figure 9:
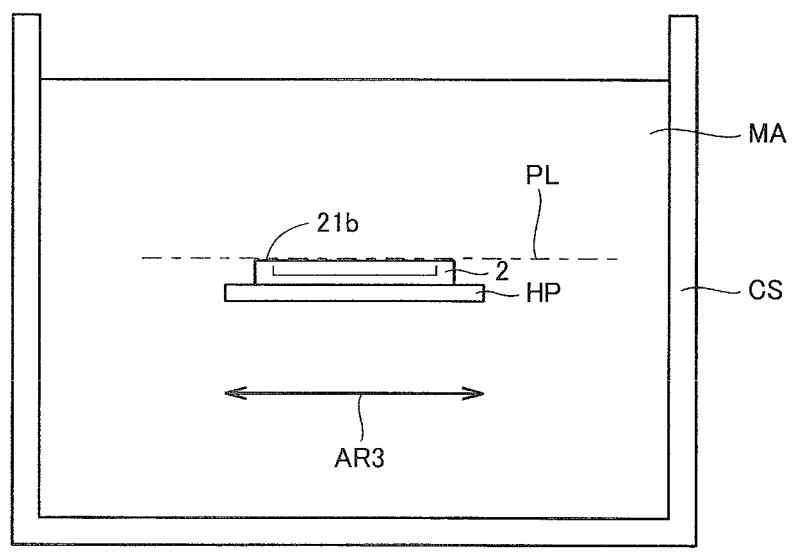
FIG. 9 is a view schematically showing a third method of wet etching of Si in one embodiment of the present invention.

FIGS. 7 to 9 are diagrams schematically showing first to third methods of wet etching of Si, in one embodiment of the present invention.

With reference to FIG. 7, the first method is a method of removing Si by spin etching. In the first method, intermediary body 2 is fixed to holding platform HP, so that the top surface 21b of Si substrate 21 faces upward. When fixing intermediary body 2 to holding platform HP, supporting member 12 is preferably gripped, in order to prevent damage of SiC film 11. Then, as indicated by the arrow AR1, holding platform HP is rotated around the rotation axis extending in a direction orthogonal to the top surface 21b. In this way, with intermediary body 2 rotated without changing the position of intermediary body 2, liquid chemical MA (etching solution) used for wet etching is injected onto top surface 21b of Si substrate 21. The rotation speed of holding platform HP is set to about 500 to 1500 rpm, for example.

Referring to FIG. 8, in the second method, multiple intermediary bodies 2 are fixed to holding platform HP in the upright state. Then, the plurality of intermediary bodies 2 are immersed in liquid chemical MA filled in reaction vessel CS. In the plane PL parallel to the top surface 21b of the Si substrate 21, intermediary bodies 2 and holding platform HP are rotated as indicated by arrow AR2, while changing the positions of intermediary bodies 2.

Referring to FIG. 9, in the third method, intermediary body 2 is fixed to holding platform HP, so that the top surface 21b of Si substrate 23 faces upward. Then, intermediary body 2 is immersed in liquid chemical MA filled in reaction vessel CS. In the plane PL parallel to the top surface 21b of the Si substrate 21, intermediary body 2 and holding platform HP are reciprocated on a straight line, as indicated by the arrow AR3.

Figure 10:
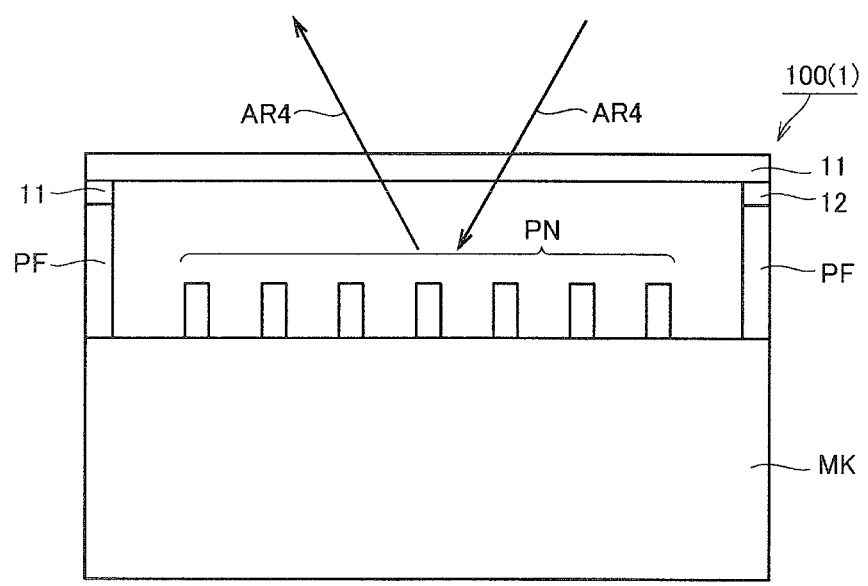
FIG. 10 shows a cross-sectional view showing usage of pellicle 1 in one embodiment of the present invention.

FIG. 10 shows a cross-sectional view showing usage of pellicle 1 in one embodiment of the present invention.

Referring to FIG. 10, a pattern PN for shielding exposure light and pellicle frame PF for supporting pellicle 1 are provided on the surface of mask MK. Pellicle 1 is fixed to pellicle frame PF by adhesion or the like, being the mask MK side as supporting member 12 and the side opposite to mask MK as SiC film 11. Pellicle 1 may be processed according to the shape of mask MK or pellicle frame PF, if necessary.

Pellicle 1 is for preventing exposure troubles caused by foreign matter attached to mask MK at the time of exposure focusing on the object to be exposed (semiconductor substrate etc.). As indicated by arrow AR4, the exposure light passes through the SiC film 11 of pellicle 3 and enters the surface of mask MK. Part of the exposure light which has passed through the gap of the pattern PN is reflected by the surface of mask MK. After that, it passes through SiC film 11 of pellicle 1. Thereafter, photoresist (not shown) applied to the surface of the exposure object is irradiated with the exposure light.

Exposure light of any wavelength can be used. In order to realize a high resolution lithography technique, it is preferable to use EUV light having wavelength of several 10 nanometers to several nanometers as exposure light. SiC is chemically stable as compared with Si, and has high transmittance and high light resistance to EUV light. Therefore, SiC is suitable as pellicle films when EUV light is used as exposure light. In particular, by using very thin SiC film 11 of 20 nanometers or more and 10 micrometers or less as a pellicle film, as like pellicle 1 in the present embodiment, higher transmittance can be realized.

According to the present embodiment, Si substrate 21 is removed completely after forming the SiC film 11. Therefore, a step for etching a part of Si substrate 21 (for example, steps for patterning and removing photoresist or a hard mask) can be omitted. As a result, it is possible to simplify the manufacturing process and to reduce the manufacturing cost of pellicles. Also, since SiC film 11 is supported by supporting member 12, thin SiC film 11 can be obtained while securing the mechanical strength of SiC film 11.

Also, when wet-etching the Si substrate 21 by moving intermediary body 2 relative to liquid chemical of the wet etching, it is possible to prevent situations where cracks enter SiC film 11 during wet etching of Si substrate 21 and where SiC film 11 peels off from Si substrate 21, and film thinning of SiC film 11 in pellicle 3 can be attempted.

In particular, when a method of removing Si by spin etching (the first method shown in FIG. 7) is adopted as a method of wet etching of Si, the time during which SiC film 11 is exposed to the liquid chemical during the wet etching is only while Si substrate 21 is removed completely and top surface 11b of SiC film 11 is exposed. During the wet etching, the bottom surface 11a of SiC film 11 is never exposed to the liquid chemical. For this reason, it is possible to minimize the damage of SiC film 11 by the liquid chemical. Furthermore, supporting member 12 and adhesive layer 13 are never exposed to the liquid chemical during wet etching. Therefore, it is unnecessary to consider the resistance of the materials constituting supporting member 12 and adhesive layer 13 to the liquid chemical. The degree of freedom of selection of materials constituting supporting member 12 and adhesive layer 13 is increased. Also, even when materials of supporting member 12 which is not resistant to the etching liquid chemical is used, supporting member 12 is not exposed to liquid chemical. Therefore, a wide range of materials can be selected as supporting member 12.

Also, by using mixed acid as liquid chemical for wet etching of Si, damage of SiC film 11 by liquid chemical can be suppressed. As a result, the yield of SiC film 11 can be improved, and a SiC films which has a large area can be formed.

Others

The above-described embodiments are to be considered in all respects as illustrative and not restrictive. The scope of the present invention is defined not by the description above but by the claims, and it is intended that all modifications within meaning and scope equivalent to the claims are included.

EXPLANATION OF REFERENCE NUMERALS

1 pellicle
2 intermediary body
11 SiC (silicon carbide) film
11a bottom surface of SiC film
11b top surface of SiC film
12 supporting member
12a through hole of supporting member
12b top surface of supporting member
13 adhesive layer
21 Si (silicon) substrate
21a bottom surface of Si substrate
21b top surface of Si substrate
CS reaction vessel
HP holding platform
MA liquid chemical
MK mask
PF pellicle frame
PL plane parallel to top surface of Si substrate
PN pattern

What is claimed is:

1. A method for manufacturing a pellicle comprising steps of
   forming a SiC film on one of principal surfaces of a substrate,
   bonding a supporting member including a through hole to a principal surface of the SiC film on an opposite side from a principal surface on a side where the substrate exists, and
   removing the substrate, after bonding the supporting member.

2. The method for manufacturing a pellicle according to claim 1, wherein
   thickness of the SiC film is 20 nanometers or more and 10 micrometers or less.

3. The method for manufacturing a pellicle according to claim 1, wherein
   the substrate is made of Si.

4. The method for manufacturing a pellicle according to claim 1, wherein
   the supporting member has a ring-like planar shape.

5. The method for manufacturing a pellicle according to claim 1, wherein
   the step for removing the substrate includes a step for relatively moving the substrate, the SiC film and the supporting member, relative to liquid chemical capable of wet etching the substrate.

6. The method for manufacturing a pellicle according to claim 5, wherein
   the substrate, the SiC film and the supporting member are moved in a direction in a plane parallel to another of the principal surfaces of the substrate, in the step of moving the substrate, the SiC film and the supporting member relative to the liquid chemical.

7. The method for manufacturing a pellicle according to claim 6, wherein
   the liquid chemical is injected onto another of the principal surfaces of the substrate, with the substrate, the SiC film, and the supporting member rotated, in the step of moving the substrate, the SiC film and the supporting member relative to the liquid chemical.

8. The method for manufacturing a pellicle according to claim 5, wherein
   mixed acid including hydrofluoric acid and nitric acid is used as the liquid chemical.

* * * * *